United States Patent
Rau et al.

(10) Patent No.: US 12,180,234 B2
(45) Date of Patent: Dec. 31, 2024

(54) METAL ORGANIC COMPOUNDS

(71) Applicant: UMICORE AG & CO. KG, Hanau-Wolfgang (DE)

(72) Inventors: Nicholas Rau, Marburg (DE); Joerg Sundermeyer, Marburg (DE); Andreas Rivas Nass, Bensheim (DE); Ralf Karch, Kleinostheim (DE); Annika Frey, Hanau (DE); Angelino Doppiu, Seligenstadt (DE); Eileen Woerner, Nidderau (DE)

(73) Assignee: UMICORE AG & CO. KG, Hanau-Wolfgang (DE)

( * ) Notice: Subject to any disclaimer, the term of this patent is extended or adjusted under 35 U.S.C. 154(b) by 930 days.

(21) Appl. No.: 17/263,195

(22) PCT Filed: Jul. 26, 2019

(86) PCT No.: PCT/EP2019/070206
§ 371 (c)(1),
(2) Date: Jan. 26, 2021

(87) PCT Pub. No.: WO2020/021078
PCT Pub. Date: Jan. 30, 2020

(65) Prior Publication Data
US 2021/0198299 A1  Jul. 1, 2021

(30) Foreign Application Priority Data
Jul. 27, 2018 (EP) ..................... 18186137

(51) Int. Cl.
C07F 15/00 (2006.01)
C23C 16/18 (2006.01)
C23C 16/455 (2006.01)

(52) U.S. Cl.
CPC .......... *C07F 15/0046* (2013.01); *C23C 16/18* (2013.01); *C23C 16/45553* (2013.01)

(58) Field of Classification Search
CPC ................................. C07F 15/0046
See application file for complete search history.

(56) References Cited

U.S. PATENT DOCUMENTS

| | | |
|---|---|---|
| 9,206,507 B2 | 12/2015 | Lansalot-Matras et al. |
| 10,407,450 B2 | 9/2019 | Harada et al. |
| 2015/0056384 A1 | 2/2015 | Gatineau et al. |
| 2017/0018425 A1 | 1/2017 | Lansalot-Matras et al. |
| 2018/0037540 A1 | 2/2018 | Yoshino et al. |
| 2018/0258526 A1 | 9/2018 | Harada et al. |

FOREIGN PATENT DOCUMENTS

| | | |
|---|---|---|
| CN | 108193194 A | 6/2018 |
| JP | 2014-534333 A | 12/2014 |
| TW | 201704200 A | 2/2017 |
| WO | 2013/117955 A1 | 8/2013 |
| WO | 2014/189340 A1 | 11/2014 |
| WO | 2016/181917 A1 | 11/2016 |
| WO | 2017/043620 A1 | 3/2017 |

OTHER PUBLICATIONS

Mbaye "a-Diimines as nitrogen ligands for ruthenium-catalyzed allylation reactions and related (pentamethylcyclopentadienyl) ruthenium complexes" Journal of Organometallic Chemistry 690 (2005) 2149-2158.*

De Klerk-Engels "Chapter 2 Attempts to insert small molecules in the Ru-CH3 bond of CpRu(CH3)(iPr-DAB)" in Organometallic Excursions Into Ruthenium Chemistry, Dissertation, Universiteit van Amsterdam, 1994.*

International Preliminary Report on Patentability dated Feb. 2, 2021 for International Patent Application No. PCT/EP2019/070206 (6 pages).

Written Opinion dated Oct. 10, 2019 for International Patent Application No. PCT/EP2019/070206 (5 pages).

International Search Report dated Oct. 10, 2019 for International Patent Application No. PCT/EP2019/070206 (4 pages).

De Klerk-Engels, B., et al. Synthesis of Cyclopentadienyl- (1,4-diisopropyl-1,3-diazabutadiene)(L)ruthenium Trifluoromethanesulfonate (L = Alkene, Alkyne, CO, Pyridine, PPh$_3$). X-ray Structure of [($\eta^5$-C$_5$H$_5$)Ru(iPr-DAB)( $\eta^2$- propene)][CF$_3$SO$_3$]t Organometallics. 1994. vol. 13, No. 8, pp. 3269-3278.

(Continued)

*Primary Examiner* — David K O'Dell
(74) *Attorney, Agent, or Firm* — Smith, Gambrell & Russell, LLP

(57) ABSTRACT

The invention relates to the synthesis and provision of a new class of volatile metal organic compounds based on bis (alkylimine)glyoxal and bis(dialkylhydrazone)glyoxal ligands in combination with cyclopentadienide and alkyl ligands for use in ALD and CVD processes.

14 Claims, No Drawings

(56) References Cited

OTHER PUBLICATIONS

De Klerk-Engels, B., et al. Alkene rotation in [Ru($\eta^5$-C$_5$H$_5$) (L$_2$) ($\eta^2$-alkene)] [CF$_3$SO$_3$] with L$_2$ = iPr- or ρTol-diazabutadiene. X-ray crystal structure of [Ru($\eta^5$-C$_5$H$_5$) (ρTol-DAB) ($\eta^2$-ethene)] [CF$_3$SO$_3$]. Inorganica Chimica Acta. 1995. vol. 240, pp. 273-284.

Zoet, R. et al. Synthesis and Spectroscopic Properties of CpRuCI(R-DAB(4e)) and CpRuCo(CO)$_3$(R-DAB(6e)). Part XVII. X-Ray Structure Determination of CpRuCo(CO)$_3$t-Bu-DAB(6e)). Inorganica Chimica Acta 1988, vol. 149, No. 2, pp. 177-185.

Mbaye, M. D., et al. α-Diimines as nitrogen ligands for ruthenium-catalyzed allylation reactions and related (pentamethylcyclopentadienyl) ruthenium complexes. Journal of Organometallic Chemistry. 2005. vol. 690, No. 8, pp. 2149-2158.

Japanese Office Action mailed Jun. 19, 2023 for Japanese Patent Application No. 2020-568807 (4 pages in Japanese with English translation).

Taiwanese Examination Report dated Feb. 13, 2023 for Taiwanese Patent Application No. 108126574 (8 pages in Chinese with English translation).

Paquette, L. A. Encyclopedia of Reagents for Organic Synthesis. vol. 6. N- Sin. John Wiley & Sons., 1995. pp. 4410-4422.

Chinese Office Action dated Apr. 20, 2023 for Chinese Patent Application No. 201980039184.3 (9 pages in Chinese with English translation).

Takashi, Inagaki, et al. Organometallic ionic liquids from half-sandwich Ru(II) complexes with various chelating ligands. Inorganica Chimica Acta. 2015. vol. 438. pp. 112-117.

Bellassoued, M., et al. A Convenient Route to (E)-α,β-Unsaturated Methyl Ketones. Phosphorus, Sulfur, and Silicon and the Related Elements. 2010. vol. 185, No. 9, pp. 1886-1895.

Kimpe, N. de, et al. A general Synthesis of Synthesis of α-Halogenated Imines. Communications, Synthesis. 1982. pp. 43-46.

Koelle, U., et al. Co-ordinatively Unsaturated Pentamethylcyclopentadienyl Ruthenium(II) Chloro and Methoxy Complexes. J. J. Chem. Soc., Chem. Commun. 1988. No. 8, pp. 549-551.

Wiklund, T., et al. Reaction between benzyllithium and 2-ethylpyridine: chiral crystals of a 1-(2-pyridyl)ethyllithium complex versus formation of lithium 4-benzyl-2-ethyl-1,4-dihydropyridinide. Monatsh Chem. 2011. vol. 142, pp. 813-819.

Extended European Search Report mailed Jan. 14, 2019 for EP 18186137.8 (5 Pages).

\* cited by examiner

METAL ORGANIC COMPOUNDS

The invention relates to the synthesis and provision of a new class of volatile and liquid ruthenium compounds that is not yet mentioned or used in the literature and is based on bis(alkylimine)glyoxal and bis(dialkylhydrazone)glyoxal ligands in combination with cyclopentadienide and alkyl ligands, for use in ALD and CVD processes.

The objective of the invention is the provision of an innovative class of ruthenium compounds that are liquid and volatile at or slightly above room temperature, for use in atomic layer deposition (ALD) or/and chemical vapor deposition (CVD) processes.

This objective is achieved by a class of compounds of the general formula

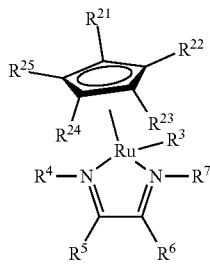

that can also be represented by the general formula $[(CpR^{21}R^{22}R^{23}R^{24}R^{25})Ru(R^4R^5(DAD)R^6R^7)R^3]$, which is used in this description as well. The cyclopentadienyl groups of the form $(CpR^{21}R^{22}R^{23}R^{24}R^{25})$ can usually form $\eta^5$- and $\eta^3$-complexes with the ruthenium.

$R^{21}$, $R^{22}$, $R^{23}$, $R^{24}$ and $R^{25}$ are, independently from each other, selected from the group consisting of H, C1-C6 linear alkyl, C3-C6 branched alkyl, C3-C6 cyclic alkyl and $NR^{31}{}_2$, wherein $R^{31}$ is selected from the group consisting of H, C1-C6 linear alkyl, C3-C6 branched alkyl, C3-C6 cyclic alkyl and C3-C6 aryl;

or $R^{21}$, $R^{22}$, $R^{23}$, $R^{24}$ and $R^{25}$ are, independently from each other, selected from the group consisting of H, C1-C3 linear alkyl, C3-C6 branched alkyl, C3-C6 cyclic alkyl and $NR^{31}{}_2$, wherein $R^{31}$ is selected from the group consisting of H, methyl, ethyl, isopropyl; or $R^{21}$, $R^{22}$, $R^{23}$, $R^{24}$ and $R^{25}$ are, independently from each other, selected from the group consisting of H, C1-C3 linear alkyl or C3-C6 branched alkyl, in particular $R^{21}$, $R^{22}$, $R^{23}$, $R^{24}$ and $R^{25}$ are, independently from each other, selected from the group consisting of H, methyl, ethyl, isopropyl and tert.-butyl. In another specific embodiment, $R^{21}$ to $R^{25}$ are not identical, but at least one of $R^{21}$ to $R^{25}$ is different;

or two of $R^{21}$, $R^{22}$, $R^{23}$, $R^{24}$ and $R^{25}$ are interconnected by a C3 to C6 alkyl, alkenyl, alkadienyl or alkatrienyl forming an annelated ring that can be substituted or unsubstituted. In a specific embodiment of the invention, two of $R^{21}$, $R^{22}$, $R^{23}$, $R^{24}$ and $R^{25}$ are so linked to each other as to form an annelated phenylene which can be substituted or unsubstituted, in sum resulting in $(CpR^{21}R^{22}R^{23}R^{24}R^{25})$ being an indenyl ligand, which can be substituted or unsubstituted.

$(R^4R^5(DAD)R^6R^7)$ represents a chelating 1,4-diazadiene or its bis-hydrazone derivative of the general formula $(R^4)$—N=$CR^5$—$CR^6$=N—$(R^7)$ wherein $R^4$ and $R^7$ can be independently selected from the group consisting of C1-C6 linear alkyl, C3-C6 branched alkyl, C3-C6 cyclic alkyl; or $R^4$ and $R^7$ can be independently selected from the group consisting of C1-C3 linear alkyl, C3-C5 branched alkyl and C3-C6 cyclic alkyl; or $R^4$ and $R^7$ are, independently from each other, selected from the group consisting of C1-C3 linear alkyl or C3-C5 branched alkyl, in particular $R^4$ and $R^7$ are, independently from each other, selected from the group consisting of methyl, ethyl, isopropyl and tert.-butyl.

$R^5$ and $R^6$ can be independently selected from the group consisting of H, C1-C6 linear alkyl, C3-C6 branched alkyl, C3-C6 cyclic alkyl; or $R^5$ and $R^6$ can be independently selected from the group consisting of H, C1-C3 linear alkyl, C3-C5 branched alkyl and C3-C6 cyclic alkyl; or $R^5$ and $R^6$ are, independently from each other, selected from the group consisting of H, C1-C3 linear alkyl or C3-C5 branched alkyl, in particular $R^5$ and $R^6$ are, independently from each other, selected from the group consisting of H, methyl, ethyl, isopropyl and tert.-butyl.

In another specific embodiment, $R^5$ and $R^6$ can be independently selected from the group consisting of H, C1-C3 linear alkyl, C3-C5 branched alkyl and C3-C6 cyclic alkyl, more specifically selected from the group consisting of H, C1-C3 linear alkyl or C3-C5 branched alkyl, in particular selected from the group consisting of H, methyl, ethyl, isopropyl and tert.-butyl and $R^4$ and $R^7$ are selected from the group consisting of C1-C3 linear alkyl, C3-C5 branched alkyl and C3-C6 cyclic alkyl, more specifically selected from the group consisting of C1-C3 linear alkyl or C3-C5 branched alkyl, in particular selected from the group consisting of methyl, ethyl, isopropyl and tert.-butyl.

In another specific embodiment, $R^4$ to $R^7$ are not identical, but at least one of $R^4$ to $R^7$ is different; more specifically, $R^4$ to $R^7$ are different from each other.

In another specific embodiment, $R^4$ and $R^7$ can, independently of each other, also be $(R^8,R^9)N$— and $(R^{12},R^{13})N$—, respectively, i.e. $R^4$ can be $(R^8,R^9)N$— and/or $R^7$ can be $(R^{12},R^{13})N$—. Consequently, in these cases $(R^4R^5(DAD)R^6R^7)$ can be selected from the group consisting of $(R^8,R^9)N$—N=$CR^5$—$CR^6$=N—$N(R^{12},R^{13})$, $R^4$—N=$CR^5$—$CR^6$=N—$N(R^{12},R^{13})$, $(R^8,R^9)N$—N=$CR^5$—$CR^6$=N—$R^7$, $R^4$—N=$CR^5$—$CR^6$=N—$R^7$ and combinations thereof.

$R^8$, $R^9$, $R^{12}$ and $R^{13}$ can be independently selected from the group consisting of H, C1-C6 linear alkyl, C3-C6 branched alkyl, or two neighbouring groups, such as $R^8$ and $R^9$ or $R^{12}$ and $R^{13}$, can together form a C3-C6 saturated or unsaturated cyclic alkyl, which may contain a heteroatom selected from O or S. More specifically, $R^8$, $R^9$, $R^{12}$ and $R^{13}$ can be independently selected from the group consisting of H, C1-C3 linear alkyl, C3-C5 branched alkyl and two neighbouring groups, such as $R^8$ and $R^9$ or $R^{12}$ and $R^{13}$ together forming a saturated C3-C6 cyclic alkyl, which may contain a heteroatom; or $R^8$, $R^9$, $R^{12}$ and $R^{13}$ can be, independently from each other, selected from the group consisting of C1-C3 linear alkyl, C3-C5 branched alkyl or two neighbouring groups, such as $R^8$ and $R^9$ or $R^{12}$ and $R^{13}$ together forming a C4 to C6 saturated cyclic alkyl, which may contain a heteroatom selected from O or S; in particular $R^8$, $R^9$, $R^{12}$ and $R^{13}$ can be, independently from each other, selected from the group consisting of methyl, ethyl, isopropyl, tert.-butyl, pyrrolidinyl, piperidinyl or morpholinyl.

In another specific embodiment, if either $R^4$ is $(R^8,R^9)N$— or $R^7$ is $(R^{12},R^{13})N$—, then the respective other one is not, thus resulting in $(R^4R^5(DAD)R^6R^7)$ being selected from the group consisting of $R^4$—N=$CR^5$—$CR^6$=N—N($R^{12}$, $R^{13}$) with $R^4$ being different from ($R^8$,$R^9$)N, ($R^8$,$R^9$)N—N=$CR^5$—$CR^6$=N—$R^7$ with $R^7$ being different from ($R^{12}$, $R^{13}$)N and combinations thereof.

$R^3$ can be selected from the group consisting of H, C1-C6 linear alkyl, C3-C6 branched alkyl, C3-C6 cyclic alkyl, C3-C6 vinyl, C3-C6 allyl, C3-C6 alkenyl; or, $R^3$ may be H, C1-C3 linear alkyl or C3-C5 branched alkyl, in particular $R^3$ may be selected from the group consisting of H, methyl, ethyl.

Yet another embodiment can be represented by the formula

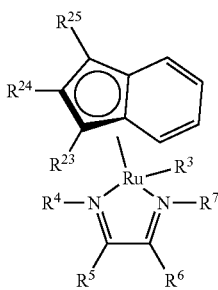

In this embodiment, $R^3$ to $R^7$ as well as $R^{23}$ to $R^{25}$ are defined as above, or $R^{23}$ to $R^{25}$ can be, independently of each other, hydrogen, methyl or ethyl, or if one of $R^{23}$ to $R^{25}$ is methyl or ethyl, then the other two are hydrogen; or, if $R^{24}$ is ethyl or methyl, in particular methyl, then $R^{23}$ and $R^{25}$ are hydrogen.

Within the scope of the present patent application, C1-C6 alkyl means methyl (C1), ethyl (C2), propyl (C3), butyl (C4), pentyl (C5) and hexyl (C6). Propyl covers both n-propyl and iso-propyl. Butyl covers n-butyl, iso-butyl, sec-butyl and tert-butyl. Pentyl covers n-pentyl (amyl), 2-pentyl (sec-pentyl), 3-pentyl, 2-methylbutyl, 3-methylbutyl (iso-pentyl or iso-amyl), 3-methylbut-2-yl, 2-methylbut-2-yl and 2,2-dimethylpropyl (neo-pentyl). The term hexyl likewise covers all possible isomers.

According to the present invention, an innovative, volatile ruthenium compound class that is liquid at room temperature and allows for purification by distillation or recondensation is provided. The compound class of the present invention having the formula [($CpR^{21}R^{22}R^{23}R^{24}R^{25}$)Ru($R^4R^5$(DAD)$R^6R^7$)$R^3$] can deposit ruthenium containing layers (elemental ruthenium layers or with a suitable co-reagent mixed ruthenium containing layers, eg. RuO) on a surface by means of a thermally-induced decomposition. As a result of the range of variation of the substitution pattern of the Cp and ($R^4R^5$(DAD)$R^6R^7$) ligands, volatility and thermal degradation can be adapted to the application in various ALD and CVD processes.

In this respect, the given ligands ($CpR^{21}R^{22}R^{23}R^{24}R^{25}$) refer to all cyclopentadienide ligands in unsubstituted form as well as with substituents $R^{21}$ to $R^{25}$ as defined above.

For example, Cp is an unsubstituted cyclopentadienide ligand (wherein in the formula ($CpR^{21}R^{22}R^{23}R^{24}R^{25}$) all substituents $R^{21}$ to $R^{25}$ are hydrogen) and $CpCH_3$ or CpMe is a monomethyl substituted cyclopentadienide ligand, Cp* is a pentamethyl substituted cyclopentadienide ligand and may be written in short $C_5Me_5$ and EtCp is a monoethyl substituted cyclopentadienide ligand with the abbreviation $C_5H_4Et$. These belong to the most common cyclopentadienide ligands.

The given ligands ($R^4R^5$(DAD)$R^6R^7$) refer to compounds of the classes of bis(alkylimine)glyoxals with the general formula ($R^4$)—N=$CR^5$—$CR^6$=N—($R^7$) or bis(dialkylhydrazone)glyoxals with the general formula ($R^8$,$R^9$)NN=$CR^5$—$CR^6$=N—N($R^{12}$,$R^{13}$), wherein $R^4$, $R^5$, $R^6$, $R^7$, $R^8$, $R^9$, $R^{12}$ and $R^{13}$ are as defined above.

By reaction of [(($CpR^{21}R^{22}R^{23}R^{24}R^{25}$))Ru($PPh_3$)$_2$Cl] or [(($CpR^{21}R^{22}R^{23}R^{24}R^{25}$))$RuCl]_4$ with $R^4R^5$(DAD)$R^6R^7$, [(($CpR^{21}R^{22}R^{23}R^{24}R^{25}$))Ru($R^4R^5$(DAD)$R^6R^7$)Cl] precursors can be produced at high yields of usually 60% or higher. By a simple reaction of these precursors with appropriate Grignard compounds of the formula $R^3$MgX, wherein X is selected from the group consisting of F, Cl, Br and I, or with lithium alkyl compounds of the formula $R^3$Li, the precursor can be converted into the respective alkyl complex [($CpR^{21}R^{22}R^{23}R^{24}R^{25}$)Ru($R^4R^5$(DAD)$R^6R^7$)$R^3$].

It is advantageous to employ [($CpR^{21}R^{22}R^{23}R^{24}R^{25}$)Ru($PPh_3$)$_2$Cl] as the starting compound. It is also possible that instead of triphenyl phosphine, $PPh_3$ as mentioned above, other suitable phosphines can be used, which encompass, for example, tricyclohexylphosphine $PCy_3$, tri-ortho-tolylphosphine and related compounds.

In general, phosphines of the type P($R^{38}$)$_3$ with $R^{38}$ being selected from the group consisting of substituted or unsubstituted C1-C6 alkyl, substituted or unsubstituted C1-C6 alkyloxy, substituted or unsubstituted C1-C6 alkenyl, substituted or unsubstituted C1-C6 alkinyl, substituted or unsubstituted C1-C6 alkadienyl, substituted or unsubstituted C3-C6 cycloalkyl, substituted or unsubstituted C5-C10 aryl, substituted or unsubstituted C5-C10 aryloxy and combinations thereof, in particular substituted with one, two or three substituents selected from the group consisting of ethyl, methyl, propyl, isopropyl, butyl, tert.-butyl, and combinations thereof, and wherein $R^{38}$ can specifically be ethyl, methyl, propyl, isopropyl, butyl, tert.-butyl, cyclohexyl, phenyl, tri-ortho-tolyl, tri-meta-tolyl, tri-para-tolyl, methoxy, ethoxy, phenyloxy and combinations thereof.

Also phosphines of the general formula ($R^{39}$)P—$R^{40}_2$ or ($R^{39}$)$_2$P—$R^{40}$, with $R^{39}$ being selected from the group consisting of substituted or unsubstituted C1-C6 alkyl, substituted or unsubstituted C1-C6 alkyloxy, substituted or unsubstituted C1-C6 alkenyl, substituted or unsubstituted C1-C6 alkinyl, substituted or unsubstituted C1-C6 alkadienyl, substituted or unsubstituted C3-C6 cycloalkyl, substituted or unsubstituted C5-C10 aryl, substituted or unsubstituted C5-C10 aryloxy and combinations thereof, in particular substituted with one, two or three substituents selected from the group consisting of ethyl, methyl, propyl, isopropyl, butyl, tert.-butyl, and combinations thereof; and $R^{40}$ being different from $R^{39}$ and selected from the group consisting of substituted or unsubstituted C1-C6 alkyl, substituted or unsubstituted C5-C10 alkyloxy, substituted or unsubstituted C1-C6 alkenyl, substituted or unsubstituted C1-C6 alkinyl, substituted or unsubstituted C1-C6 alkadienyl, substituted or unsubstituted C3-C6 cycloalkyl, substituted or unsubstituted C5-C10 aryl, substituted or unsubstituted C5-C10 aryloxy and combinations thereof, in particular substituted with one, two or three substituents selected from the group consisting of ethyl, methyl, propyl, isopropyl, butyl, tert.-butyl, cyclohexyl, methoxy, ethoxy, phenyloxy and combinations thereof. More specifically, $R^{39}$ and $R^{40}$ can be ethyl, methyl, propyl, isopropyl, butyl, tert.-butyl, cyclohexyl, phenyl, tri-ortho-tolyl, tri-meta-tolyl, tri-para-tolyl, methoxy, ethoxy, phenyloxy and combinations thereof and are different from each other.

C1-C6 alkyl means methyl (C1), ethyl (C2), propyl (C3), butyl (C4), pentyl (C5) and hexyl (C6). Propyl covers both n-propyl and iso-propyl. Butyl covers n-butyl, iso-butyl, sec-butyl and tert-butyl. Pentyl covers n-pentyl (amyl), 2-pentyl (sec-pentyl), 3-pentyl, 2-methylbutyl, 3-methylbutyl (iso-pentyl or iso-amyl), 3-methylbut-2-yl, 2-methylbut-2-yl and 2,2-dimethylpropyl (neo-pentyl). The term hexyl likewise covers all possible isomers.

Consequently, $[(CpR^{21}R^{22}R^{23}R^{24}R^{25})Ru(P(R^{38})_3)_2Cl]$, $[(CpR^{21}R^{22}R^{23}R^{24}R^{25})Ru((R^{39})P-R^{40}_2)_2Cl]$ and $[(CpR^{21}R^{22}R^{23}R^{24}R^{25})Ru((R^{39})_2P-R^{40})_2Cl]$ can be employed as well for reacting with with $R^4R^5(DAD)R^6R^7$ to obtain the precursors $[((CpR^{21}R^{22}R^{23}R^{24}R^{25}))Ru(R^4R^5(DAD)R^6R^7)Cl]$. It was surprisingly found that when the reaction was carried out in the presence of pure oxygen, high yields of 70%, higher purities up to 99% or both can be achieved. The presence of oxygen can be achieved, for example, by passing a stream of pure oxygen gas, $O_2$, through the reaction mixture.

This surprising effect could be explained after its discovery because it was found that in this case phosphine oxide is formed and $(R^4R^5(DAD)R^6R^7)$ becomes the stronger coordinating ligand in the reaction mixture and thus an increased yield of the desired product could be found.

Accordingly, the present invention also relates to a method for the production of a compound of formula $[(CpR^{21}R^{22}R^{23}R^{24}R^{25})Ru(R^4R^5(DAD)R^6R^7)R^3]$ comprising the following steps:
a) reacting $[(CpR^{21}R^{22}R^{23}R^{24}R^{25})Ru(PPh_3)_2Cl]$ or $[(CpR^{21}R^{22}R^{23}R^{24}R^{25})RuCl]_4$ with $R^4R^5(DAD)R^6R^7$ to obtain $[(CpR^{21}R^{22}R^{23}R^{24}R^{25})Ru(R^4R^5(DAD)R^6R^7)Cl]$,
b) reacting $[(CpR^{21}R^{22}R^{23}R^{24}R^{25})Ru(R^4R^5(DAD)R^6R^7)Cl]$ with $R^3MgX$ or $R^3Li$ to obtain $[(CpR^{21}R^{22}R^{23}R^{24}R^{25})Ru(R^4R^5(DAD)R^6R^7)R^3]$,
wherein X is selected from the group consisting of F, Cl, Br and I.

More specifically, the present invention also relates to a method for the production of a compound of formula $[(CpR^{21}R^{22}R^{23}R^{24}R^{25})Ru(R^4R^5(DAD)R^6R^7)R^3]$ comprising the following steps:
a) reacting $[(CpR^{21}R^{22}R^{23}R^{24}R^{25})Ru(PPh_3)_2Cl]$ with $R^4R^5(DAD)R^6R^7$ to obtain $[(CpR^{21}R^{22}R^{23}R^{24}R^{25})Ru(R^4R^5(DAD)R^6R^7)Cl]$ in the presence of pure oxygen,
b) reacting $[(CpR^{21}R^{22}R^{23}R^{24}R^{25})Ru(R^4R^5(DAD)R^6R^7)Cl]$ with $R^3MgX$ or $R^3Li$ to obtain $[(CpR^{21}R^{22}R^{23}R^{24}R^{25})Ru(R^4R^5(DAD)R^6R^7)R^3]$,
wherein X is selected from the group consisting of F, Cl, Br and I.

Another embodiment also relates to a method for the production of a compound of formula $[(CpR^{21}R^{22}R^{23}R^{24}R^{25})Ru(R^4R^5(DAD)R^6R^7)Cl]$ comprising the step:
a) reacting $[(CpR^{21}R^{22}R^{23}R^{24}R^{25})Ru(PPh_3)_2Cl]$ with $R^4R^5(DAD)R^6R^7$ to obtain $[(CpR^{21}R^{22}R^{23}R^{24}R^{25})Ru(R^4R^5(DAD)R^6R^7)Cl]$ in the presence of pure oxygen, wherein X is selected from the group consisting of F, Cl, Br and I. In particular, the presence of pure oxygen means that a stream of pure oxygen ($O_2$) gas is passed through the reaction mixture.

In an aspect of the present invention, step a) and/or step b) is/are carried out in a solvent. In general, aromatic solvents and ethers are suitable solvents. In particular, aromatic compounds having 6 to 15 carbon atoms are suitable solvents and can be substituted or unsubstituted compounds, such as benzene, toluene, ortho- meta- or para-xylene, mesitylen, ethylbenzene, 1,2-, 1,3-, or 1,4-diethylbenzene ore triethylbenzene can be employed as solvents. In particular, linear or cyclic ethers with two to 20 carbon atoms can be used, such as dimethyl ether, ethylmethyl ether, diethyl ether, ethyl-tert.-butylether, 2-Methoxy-2-methylpropane, tetrahydropyrane, dioxane, tetrahydrofuran, glyme ordiglyme. Usually, good results can be achieved with toluene or tetrahydrofurane. It is known to the person of normal skill in the art that lithium organic compounds can, under certain conditions, react with aromatic solvents, see Wiklund, T., Olsson, S. & Lennartson, A. Monatsh Chem (2011) 142: 813. The artisan thus would, in order to avoid side reactions, check the suitability of the solvents for the specific reactions and might rather elect linear or cyclic ethers over aromatic solvents when employing lithium organic compounds such as $R^3Li$.

In another aspect of the present invention, step a) and/or step b) can in general be carried out at a temperature of from about −78° C. to about 40° C., or from about −30° C. to about 30° C., or from about 0° C. to about 25° C. Good results were obtained by starting the reaction at a temperature of 0° C. or less and allow the reaction mixture to warm up to ambient temperature in the course of the reaction, normally without employing a means for heat treatment.

In a further aspect of the present invention, step a) and/or step b) can in general be carried out for a period of time of 3 minutes to 12 hours, or from 10 minutes to 8 hours or from 20 minutes to 6 hours or from 30 minutes to 3 hours. Good results have been achieved by reaction times of about 3 hours or less.

By varying the substitution patterns on the ligands, the thermal properties of the compound class $[(CpR^{21}R^{22}R^{23}R^{24}R^{25})Ru(R^4R^5(DAD)R^6R^7)R^3]$ can also be adapted, depending on the application. As an example in this respect, the two compounds $[(CpMe)Ru(^{iPr}DAD)Me]$ and $[(Cp*)Ru(^{iPr}DAD)Me]$ are mentioned. In the Ligand ($^{iPr}DAD$), $R^4$ and $R^7$ are Isopropyl, $R^5$ and $R^6$ are H.

While $[(Cp*)Ru(^{iPr}DAD)Me]$ has a melting point of 53° C., $[(CpMe)Ru(^{iPr}DAD)Me]$ is liquid at room temperature.

As a result of the low molar masses (e.g., for $[(CpMe)Ru(^{iPr}DAD)Me]$ M=335.46 g/mol) in connection with being present as a single molecule, the new compounds are highly volatile compounds, which can be excellently purified by sublimation or distillation.

The compound according to the invention $[(MeCp)Ru(^{iPr}DAD)Me]$ exhibits a narrow, single-stage decomposition curve when the compound is heated to 600° C. In the process, the 3% degradation already appears at 163.26° C. A 50% degradation of the compound appears at 194° C., with a total mass loss of 98.93% at 600° C.

By reacting the known precursor $[(CpMe)Ru(PPh_3)_2Cl]$ with bis(isopropylimine)glyoxal under oxidative conditions ($O_2$) in boiling toluene, the precursor $[(CpMe)Ru(^{iPr}DAD)Cl]$ can be obtained at an 84% yield. As a result of the following conversion with MeMgBr solution at 0° C. up to room temperature, the target compound $[(CpMe)Ru(^{iPr}DAD)Me]$ can be obtained at a yield of 73%. The total yield of the synthesis route is, at 61%, very good. By means of distillation, the compound $[(MeCp)Ru(^{iPr}DAD)Me]$ can, moreover, be purified easily on a large scale.

$[(MeCp)Ru(^{iPr}DAD)Me]$ already exhibits a high vapor pressor at 70° C. at a pressure of $10^{-3}$ mbar. The compound $[(MeCp)Ru(^{iPr}DAD)Me]$ exhibits a narrow, single-stage decomposition curve when the compound is heated to 600° C. In the process, the 3% degradation already appears at 163.26° C. A 50% degradation of the compound appears at 194° C., with a total mass loss of 98.93% at 600° C.

Accordingly, the present invention also relates to the use of a compound of formula [(CpR$^{21}$R$^{22}$R$^{23}$R$^{24}$R$^{25}$)Ru(R$^4$R$^5$(DAD)R$^6$R$^7$)R$^3$] to deposit elemental ruthenium or ruthenium containing layers on a surface.

In an aspect of the present invention, deposition is accomplished by means of a thermally-induced decomposition In a further aspect of the present invention, deposition is achieved within an ALD (Atomic Layer Deposition) or a CVD (Chemical Vapor Deposition) process.

The present invention is further illustrated by the following non-limiting examples.

EXAMPLES

Synthesis of [Cp*RuCl]$_4$ via Superhydride (Paquette, L. A. *E-EROS: Encyclopedia of reagents for organic synthesis*, Online ed.; WileyInterscience, 2010)

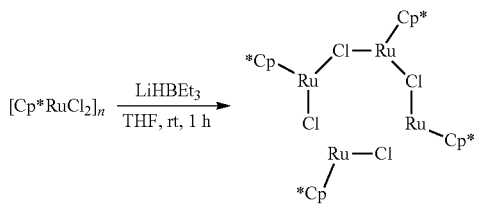

The synthesis of [Cp*RuCl]$_4$ was conducted after Kimpe, N. de; Verhé, R.; Buyck, L. de; Moens, L.; Schamp, N. *Synthesis* 1982, 1982 (01), 43-46. A Schlenk flask was charged with 5.10 g [Cp*RuCl$_2$]$_n$ (16.58 mmol, 1 eq) and 30 mL THF (abs.). Then 16.6 mL LiHBEt$_3$ solution (1 M in THF, 16.6 mmol, 1.01 eq) was slowly added. While adding a gas evolution could be observed. The solution turns dark brown and an orange precipitate is formed. The solid was filtered and rinsed with small amounts of THF. After drying in vacuum the product was obtained as brown-orange solid 3.56 g (76%).

Synthesis of [Cp*RuCl]$_4$ Via Two-Step Synthesis (Koelle, U.; Kossakowski, J. *J. Chem. Soc., Chem. Commun.* 1988, No. 8, 549)

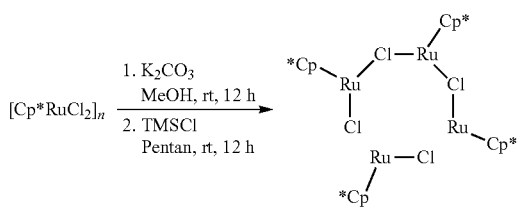

[Cp*RuCl]$_4$ was synthesized according to Bellassoued, M.; Aatar, J.; Bouzid, M.; Damak, M. *Phosphorus, Sulfur, and Silicon and the Related Elements* 2010, 185 (9), 1886-1895. A flask was charged under argon with 18.0 g of K$_2$CO$_3$ (exc.) and 100 mL MeOH (abs.). 4.0 g of [Cp*RuCl$_2$]$_n$ (13.02 mmol) were added. The colorless suspension turns dark red immediately. The solution was stirred at ambient temperature for 12 h and the red solution was filtered of the K$_2$CO$_3$ and the filter pad was thoroughly washed with pentane. The solution was evaporated to one third of the volume and a small excess of TMSCl was slowly added. The solution turns brown slowly. After staying for 2 days at 30° C. an orange precipitate forms, which was filtered off and rinsed with small amounts of pentane. The product could be obtained as orange-brown solid in quantitative yield.

Synthesis of [(MeCp)Ru($^{iPr}$DAD)Cl]

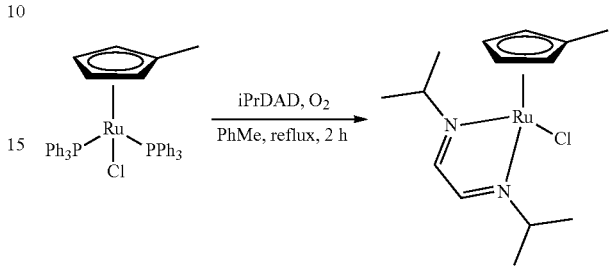

[(MeCp)RuCl($^{iPr}$DAD)] was prepared by an improved synthesis based on Zoet, R.; van Koten, G.; van der Panne, Albertus L. J.; Versloot, P.; Vrieze, K.; Stam, C. H. *Inorganica Chimica Acta* 1988, 149 (2), 177-185.

[(MeCp)RuCl(PPh$_3$)$_2$] (1.66 g, 2.24 mmol, 1 Äq.) and iPrDAD (1.57 g, 11.21 mmol, 5 Äq.) were dissolved in 200 mL of toluene and heated for 2 hours under reflux while a gentle stream of oxygen (O$_2$) was passed through the reaction mixture. In the course of the reaction the color changed from orange-red to bright red. The solvent was removed in vacuo and the solid dissolved in dichloro methane. This solution was purified by column chromatography (hexane/diethyl ether 4:1). The first fraction mainly contained the starting material [(MeCp)RuCl(PPh$_3$)$_2$] and was discarded. The second fraction contained the product. The solvent was removed and the product [(MeCp)Ru(iPrDAD)Cl] was obtained as a viscous oil of dark red color. Yield: 71%, Purity: >99%.

$^1$H-NMR (CDCl$_3$, 300 MHz, 300 K): δ=8.43 (s, 2H), 4.59 (dt, 2H), 4.30 (d, 4H), 1.88 (s, 3H), 1.54 (t, 12H).

Synthesis of [(Cp*)Ru($^{iPr}$DAD)Cl]

was conducted according to Mbaye, M. D.; Demerseman, B.; Renaud, J.-L.; Bruneau, C. *Journal of Organometallic Chemistry* 2005, 690 (8), 2149-2158.

Synthesis of [(MeCp)Ru($^{iPr}$DAD)Me]

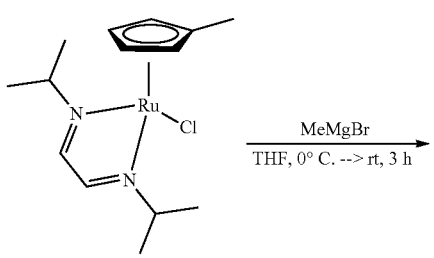

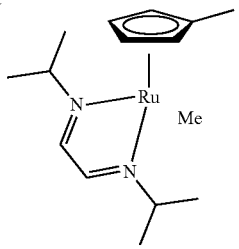

A flask was charged with 10.56 mL of a [(MeCp)Ru($^{iPr}$DAD)Cl] solution (0.079 M in THF (abs.), 0.84 mmol, 1 eq). At 0° C. 0.28 mL of a MeMgBr solution (3 M in Et$_2$O (abs.), 0.84 mmol, 1 eq) was added slowly. The reaction mixture was warmed to rt for 20 min, whereas the solution changes color from deep red-brown to neon yellow-dark brown. After further 1 h of stirring at rt, the solvent was evaporated and the residue extracted with a solvent mixture of toluene (abs.)/pentane (abs.) 1:9. The combined extracts were evaporated to dryness and the residue was extracted with pentane (abs.). After evaporation of the solvent, the product was obtained as dark brown liquid with neon yellow luster (219 mg, 73%).

$^1$H-NMR (C$_6$D$_6$, 300 MHz, 300 K): δ (ppm)=7.76 (s, 2H), 4.70 (t, J=1.8 Hz, 2H), 4.25 (s, 1H), 4.19 (quint, J=13.2, 6.6 Hz, 1H), 1.69 (s, 3H), 1.29 (dd, J=6.6, 3.4 Hz, 13H), 0.07 (s, 3H).

$^{13}$C-NMR (C$_6$D$_6$, 75 MHz, 300 K): δ (ppm)=142.20 (C), 100.24 (C$_q$), 80.50 (E), 78.16 (D), 66.12 (B), 25.01 (s, A), 24.76 (s, A) 13.16 (Me$_{Cp}$), 9.05 (Me).

EI+/HRMS m/z (%)=336.11291 ([M]+, calc. 336.11435).

CHN C$_{15}$H$_{26}$N$_2$Ru: calc. N, 8.35, C, 53.71, H, 7.81; found N, 11.45, C, 53.63, H, 7.57.

TGA (10 Kmin$^{-1}$; T$_{max}$=600° C.): 3%-deg.=163.26° C.; Onset=194.79° C.

Synthesis of [(Cp*)Ru($^{iPr}$DAD)Me]

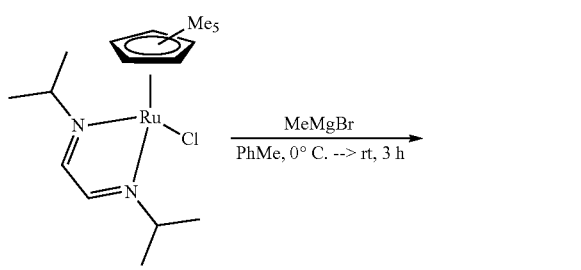

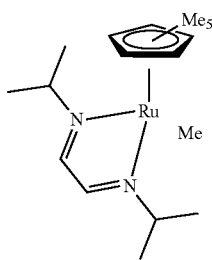

A flask was charged with 300 mg [(Cp*)Ru($^{iPr}$DAD)Cl] (0.75 mmol, 1 eq) and added 10 mL of toluene (abs.). At 0° C. 0.243 mL of a MeMgBr solution (3 M in Et$_2$O (abs.), 0.75 mmol, 1 eq) was added slowly. The reaction mixture was warmed to rt for 20 min, whereas the solution changes color from deep red-brown to neon yellow-dark brown. After further 3 h of stirring at rt, the reaction mixture was filtered and the solvent of the filtrate evaporated. The residue was extracted with pentane (abs.) and solvent of the combined extracts was evaporated. The product was obtained as dark brown oil with neon yellow luster, which solidifies after longer standing. (268 mg, 68%).

Melting point: T$_m$=53° C.

$^1$H-NMR (C$_6$D$_6$, 300 MHz, 300 K): δ (ppm)=7.80 (s, 2H), 4.37 (quint, J=13.5, 6.7 Hz, 2H), 1.69 (s, 15H), 1.33 (d, J=6.8 Hz, 6H), 1.30 (d, J=6.7 Hz, 6H), −0.14 (s, 3H).

$^{13}$C-NMR (C$_6$D$_6$, 75 MHz, 300 K): δ (ppm)=138.92 (s), 89.54 (s), 62.10 (s), 24.09 (s), 23.30 (s), 13.22 (s), 10.11 (s).

EI+/HRMS m/z (%)=392.17791 ([M]+, calc. 392.17706).

CHN C$_{19}$H$_{34}$N$_2$Ru: calc. N, 7.15, C, 58.28, H, 8.75; found N, 7.49, C, 57.86, H, 8.30.

TGA (10 Kmin$^{-1}$; T$_{max}$=600° C.): 3%-deg.=192.59° C.; Onset=209.23° C.

The syntheses conducted for the compounds of the present invention are readily reproducible. The starting materials of these compounds are available via literature known and well established routes.

The compounds of the present invention exhibit formidable thermal properties regarding ALD processing. The thermal decomposition points are located around 200° C. In case of [(MeCp)Ru($^{iR'}$DAD)Me] a one-step and for [(Cp*)Ru($^{iR'}$DAD)Me] a two-step decomposition can be found. According to the mass spectra the fragments with the highest abundance are either [(Cp)Ru(DAD)] or [(Cp)Ru] fragments. Especially the fragment [(Cp)Ru] should exhibit a high volatility and thermal stability, which makes it an optimal reactive species in ALD. In a thermal measurement from 25-600° C. 98% [(MeCp)Ru(DAD)Me] and 81% [(Cp*)Ru(DAD)Me] are decomposed or evaporated.

The invention claimed is:

1. Compound having formula

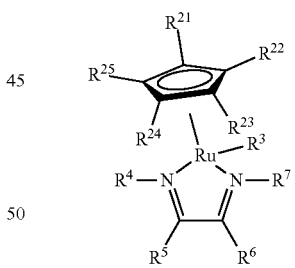

or formula [(CpR$^{21}$R$^{22}$R$^{23}$R$^{24}$R$^{25}$)Ru(R$^4$R$^5$ (DAD) R$^6$R$^7$) R$^3$], wherein R$^3$ is selected from H, C1-C3 linear alkyl, or C3-C5 branched alkyl, wherein (R$^4$R$^5$ (DAD) R$^6$R$^7$) is selected from a chelating 1,4-diazadiene or a bis-hydrazone derivative of the general formula (R$^4$)—N═CR$^5$—CR$^6$═N—(R$^7$);

wherein R$^4$ and R$^7$ are independently selected from the group consisting of C1-C3 linear alkyl, C3-C5 branched alkyl, and C3-C6 cyclic alkyl; or R$^4$ is (R$^8$, R$^9$)N— and R$^7$ is (R$^{12}$,R$^{13}$)N—, and R$^8$, R$^9$, R$^{12}$ and R$^{13}$ are independently selected from the group consisting of H, C1-C3 linear alkyl, C3-C5 branched alkyl, or two neighboring groups, selected from R$^8$ and R$^9$ or $R^{12}$ and $R^{13}$, which form a C3-C6 saturated or unsaturated cyclic alkyl, which optionally contain a heteroatom selected from O or S;

$R^5$ and $R^6$ are independently selected from the group consisting of H, C1-C6 linear alkyl, C3-C6 branched alkyl, and C3-C6 cyclic alkyl;

wherein $R^{21}$, $R^{22}$, $R^{23}$, $R^{24}$ and $R^{25}$ are, independently from each other, selected from the group consisting of C1-C3 linear alkyl, C3-C6 branched alkyl, C3-C6 cyclic alkyl and $NR^{31}{}_2$, wherein $R^{31}$ is selected from the group consisting of H, methyl, ethyl, and isopropyl or two of $R^{21}$, $R^{22}$, $R^{23}$, $R^{24}$ and $R^{25}$ are so linked to each other to form a phenylene.

2. A compound according to claim 1, wherein ($R^4R^5$ (DAD) $R^6R^7$) is a chelating 1,4-diazadiene derivative of the general formula ($R^4$)—N═$CR^5$—$CR^6$—N—($R^7$) wherein $R^4$ and $R^7$, are independently selected from the group consisting of C1-C3 linear alkyl, and C3-C5 branched alkyl;

$R^5$ and $R^6$ are independently selected from the group consisting of H, C1-C3 linear alkyl, and C3-C5 branched alkyl;

$R^{21}$, $R^{22}$, $R^{23}$, $R^{24}$ and $R^{25}$ are, independently from each other, selected from the group consisting of C1-C3 linear alkyl, and C3-C6 branched alkyl.

3. A compound of claim 1, wherein $R^{21}$, $R^{22}$, $R^{23}$, $R^{24}$ and $R^{25}$ are, independently from each other, selected from the group consisting of methyl, ethyl, isopropyl and tert.-butyl.

4. A compound of claim 1, wherein $R^{21}$ to $R^{25}$ are not identical; or at least one of $R^{21}$ to $R^{25}$ is different.

5. A compound of claim 1, wherein $R^{21}$ to $R^{25}$ are identical.

6. A compound of claim 1, wherein $R^4$ and $R^7$ are, independently from each other, selected from the group consisting of methyl, ethyl, isopropyl and tert.-butyl.

7. A compound of claim 1, wherein $R^5$ and $R^6$ are, independently from each other, selected from the group consisting of H, methyl, ethyl, isopropyl and tert.-butyl.

8. A compound of claim 1, wherein $R^4$ to $R^7$ are not identical, or at least one of $R^4$ to $R^7$ is different.

9. A compound of claim 1, wherein $R^4$ and $R^7$ are identical.

10. A compound of claim 1, wherein $R^8$, $R^9$, $R^{12}$ and $R^{13}$ are independently from each other, selected from C1-C3 linear alkyl, C3-C5 branched alkyl or two neighboring groups, $R^8$ and $R^9$ or $R^{12}$ and $R^{13}$ together forming a C4 to C6 saturated cyclic alkyl, which optionally contain a heteroatom selected from O or S.

11. A compound of claim 1, wherein $R^8$, $R^9$, $R^{12}$ and $R^{13}$ are independently from each other, selected from methyl, ethyl, isopropyl, tert.-butyl, pyrrolidinyl, piperidinyl or morpholinyl.

12. A compound of claim 1, wherein ($R^4R^5$ (DAD) $R^6R^7$) being selected from the group consisting of ($R^8$,$R^9$)N—N═$CR^5$—$CR^6$—N—N($R^{12}$,$R^{13}$), $R^4$—N═$CR^5$—$CR^6$—N—N($R^{12}$,$R^{13}$) with $R^4$ being different from ($R^8$,$R^9$)N, ($R^8$,$R^9$)N—N═$CR^5$—$CR^6$—N—$R^7$ with $R^7$ being different from ($R^{12}$,$R^{13}$)N, $R^4$—N—$CR^5$—$CR^6$—N—$R^7$ with $R^4$ being different from ($R^8$,$R^9$)N and $R^7$ being different from ($R^{12}$,$R^{13}$)N.

13. A compound of claim 1, wherein $R^3$ is selected from H, methyl or ethyl.

14. A compound of claim 1, wherein the ($CpR^{21}R^{22}R^{23}R^{24}R^{25}$) is a pentamethyl substituted cyclopentadienide ligand Cp*.

* * * * *